(12) United States Patent
Chen (10) Patent No.: US 10,177,147 B2
(45) Date of Patent: Jan. 8, 2019

(54) SEMICONDUCTOR DEVICE AND STRUCTURE

(71) Applicant: MediaTek Inc., Hsin-Chu (TW)

(72) Inventor: Yiwei Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/134,897

(22) Filed: Apr. 21, 2016

(65) Prior Publication Data

US 2016/0336316 A1 Nov. 17, 2016

Related U.S. Application Data

(60) Provisional application No. 62/162,289, filed on May 15, 2015.

(51) Int. Cl.
| | | |
|---|---|---|
| *H01L 27/092* | (2006.01) | |
| *H01L 27/02* | (2006.01) | |
| *H01L 27/118* | (2006.01) | |

(52) U.S. Cl.
CPC ........ *H01L 27/092* (2013.01); *H01L 27/0207* (2013.01); *H01L 2027/11837* (2013.01)

(58) Field of Classification Search
CPC .............. H01L 27/092; H01L 27/0207; H01L 2027/11837; H03F 3/45179; H03F 3/4521
See application file for complete search history.

(56) References Cited

U.S. PATENT DOCUMENTS

| | | | | |
|---|---|---|---|---|
| 6,046,638 A | * | 4/2000 | Hogeboom | H03K 5/2481 330/252 |
| 8,159,301 B1 | * | 4/2012 | Duffy | H03F 3/45219 330/253 |
| 2009/0121766 A1 | * | 5/2009 | Jeon | G06F 1/10 327/291 |
| 2010/0045341 A1 | * | 2/2010 | Kim | H03K 19/0005 326/30 |
| 2011/0133774 A1 | * | 6/2011 | Kim | H03K 19/0005 326/30 |

FOREIGN PATENT DOCUMENTS

| | | |
|---|---|---|
| CN | 1178945 A | 4/1998 |
| CN | 103986443 A | 8/2014 |

* cited by examiner

*Primary Examiner* — Thanh Y Tran
(74) *Attorney, Agent, or Firm* — McClure, Qualey & Rodack, LLP (57) ABSTRACT

A semiconductor device is provided. Gates of first PMOS and NMOS transistors are coupled together for receiving an input signal. Gates of second PMOS and NMOS transistors are coupled together. Gates of third PMOS and NMOS transistors are coupled together. Gates of fourth PMOS and NMOS transistors are coupled together. Drains of fourth PMOS and NMOS transistors are coupled together for providing an output signal. When the first, second, third and fourth NMOS transistors are connected in parallel and the first, second, third and fourth PMOS transistors are connected in parallel, the output signal is provided according to the input signal and a first logic function. When the first and second NMOS transistors are connected in serial and the first and second PMOS transistors are connected in serial, the output signal is provided according to the input signal and a second logic function.

8 Claims, 8 Drawing Sheets

SEMICONDUCTOR DEVICE AND STRUCTURE

CROSS REFERENCE TO RELATED APPLICATIONS

This Application claims priority of U.S. Provisional Application No. 62/162,289, filed on May 15, 2015, the entirety of which is incorporated by reference herein.

BACKGROUND OF THE INVENTION

Field of the Invention

The invention relates to a semiconductor device, and more particularly to a semiconductor structure of a semiconductor device.

Description of the Related Art

In the design process for an IC chip, various clock trees are inserted into the circuit design of the IC chip, and their physical placement is adjusted accordingly. Clock adjustment is then performed on the circuit. In the process of designing and inserting the clock tree, it is important to consider the issue of clock skew. All sequential logic units (e.g. registers and latches) of the circuit need a clock signal. However, the time of the clock signal arriving at different sequential logic units is different because the path from the clock source to each sequential logic unit is different. This time difference is also called clock skew. There are various factors leading to clock skew, including the path length difference among different units, the load number and size difference, the difference caused by OCV (on-chip variation), etc. OCV includes manufacturing technical variation, operational voltage variation, ambient temperature variation, etc.

In general, clock tree synthesis (CTS) is performed to insert buffers to reduce timing skew and to construct a clock tree to reach an optimized solution by taking timing skew, circuit-area, and power consumption into consideration. However, the timing skew of the clock tree varies quite obviously for different process, temperature, and voltage corners.

BRIEF SUMMARY OF THE INVENTION

A semiconductor device and a semiconductor structure are provided. An embodiment of a semiconductor device is provided. The semiconductor device comprises a first NMOS transistor, a second NMOS transistor, a third NMOS transistor, a fourth NMOS transistor, a first PMOS transistor comprising a gate coupled to a gate of the first NMOS transistor for receiving an input signal, a second PMOS transistor comprising a gate coupled to a gate of the second NMOS transistor, a third PMOS transistor comprising a gate coupled to a gate of the third NMOS transistor, and a fourth PMOS transistor comprising a gate coupled to a gate of the fourth NMOS transistor, and a drain coupled to a drain of the fourth NMOS transistor for providing an output signal. When the first, second, third and fourth NMOS transistors are connected in parallel and the first, second, third and fourth PMOS transistors are connected in parallel, the output signal is provided according to the input signal and a first logic function. When the first and second NMOS transistors are connected in serial, and the first and second PMOS transistors are connected in serial, the output signal is provided according to the input signal and a second logic function.

Furthermore, an embodiment of a semiconductor structure is provided. The semiconductor structure comprises a semiconductor substrate, a plurality of metal layers on the semiconductor substrate, and an oxide diffusion (OD) layer in the semiconductor substrate. The semiconductor substrate comprises first, second, third, fourth PMOS transistors, and first, second, third, fourth NMOS transistors. The first, second, third and fourth PMOS transistors are disposed in a first row. The first, second, third and fourth NMOS transistors are disposed in a second row adjacent to the first row. The gates of the first PMOS and NMOS transistors are connected together for receiving an input signal through the metal layers. The gates of the second PMOS and NMOS transistors are connected together through the metal layers. The gates of the third PMOS and NMOS transistors are connected together through the metal layers. The gates of the fourth PMOS and NMOS transistors are connected together through the metal layers, and drains of the fourth PMOS and NMOS transistors are connected together for providing an output signal via the metal layer. When the first, second, third and fourth NMOS transistors are connected in parallel through the metal layers and the OD layer, the first, second, third and fourth PMOS transistors are connected in parallel through the metal layers and the OD layer. When the first and second NMOS transistors are connected in serial through the metal layers and the OD layer, the first and second PMOS transistors are connected in serial through the metal layers and the OD layer. When the third and fourth NMOS transistors are connected in serial through the metal layers and the OD layer, the third and fourth PMOS transistors are connected in serial through the metal layers and the OD layer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
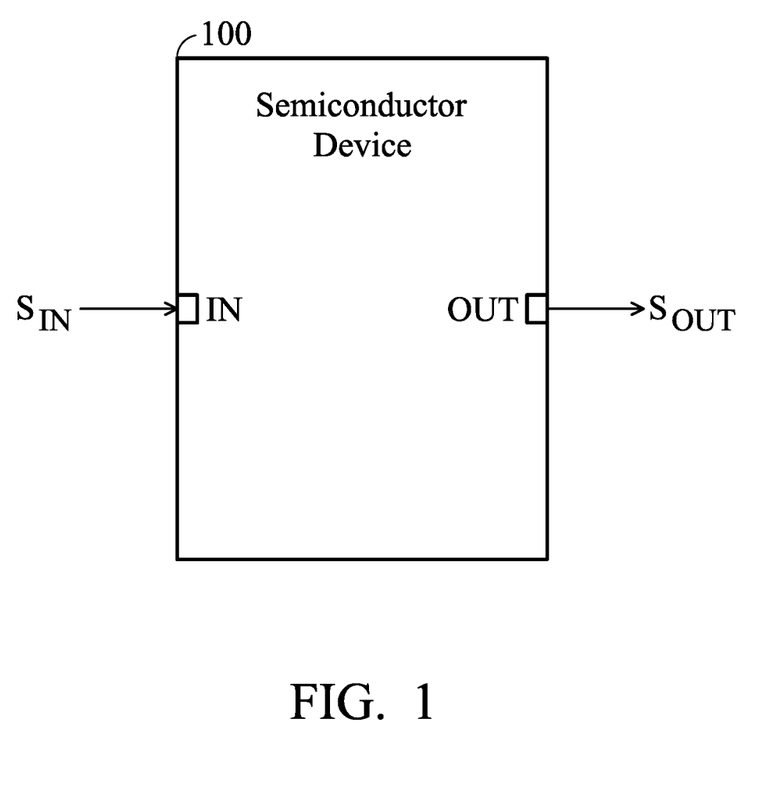
FIG. 1 shows a semiconductor device according to an embodiment of the invention.

FIG. 1 shows a semiconductor device 100 according to an embodiment of the invention. The semiconductor device 100 is a logic device capable of receiving an input signal $S_{IN}$ at an input terminal IN to provide an output signal $S_{OUT}$ at an output terminal OUT according to a specific logic function. In some embodiments, the semiconductor device 100 is an inverter, and the output signal $S_{OUT}$ provided by the inverter is complementary to the input signal $S_{IN}$ with strong driving capability or large delay capability. In some embodiments, the semiconductor device 100 is a buffer, e.g. a clock buffer, and the output signal $S_{OUT}$ provided by the buffer is a signal similar to the input signal $S_{IN}$ with strong driving capability or large delay capability. The semiconductor device 100 comprises a plurality of transistors P1-P4 and N1-N4, and the number of the NMOS transistors N1-N4 is identical to the number of the PMOS transistors P1-P4. It should be noted that no matter what the specific logic function is, the semiconductor device 100 can perform the specific logic function according to the same transistors sizes, number and layout, and a type of the specific logic function is determined according to a plurality of connection layers on the transistors.

Figure 2:
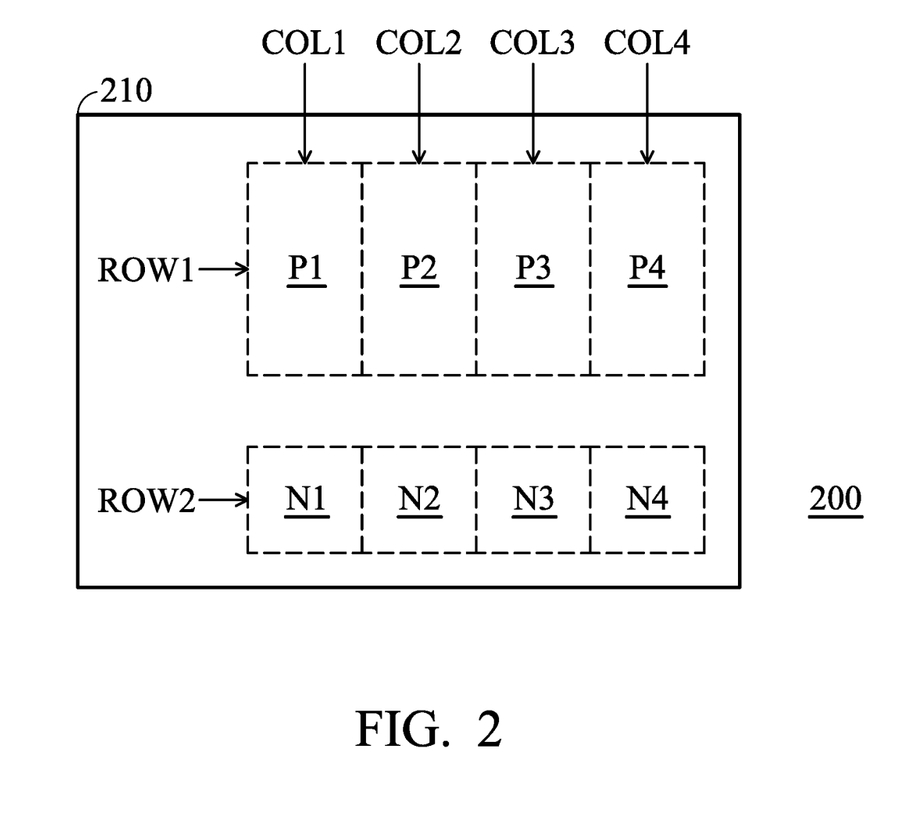
FIG. 2 shows a top view of a semiconductor structure of the semiconductor device of FIG. 1 according to an embodiment of the invention.

FIG. 2 shows a top view of a semiconductor structure 200 of the semiconductor device 100 of FIG. 1 according to an embodiment of the invention. In the semiconductor structure 200, the PMOS transistors P1-P4 and the NMOS transistors N1-N4 are implemented in a semiconductor substrate 210 of a chip. In order to simplify the description, the forming process of the transistors P1-P4 and N1-N4 will not be described further. In the semiconductor structure 200, the PMOS transistors P1-P4 are disposed in a first row ROW1, and the NMOS transistors N1-N4 are disposed in a second row ROW2 adjacent to the first row ROW1. Furthermore, the PMOS transistor P1 and the NMOS transistor N1 are disposed in a first column COL1. The PMOS transistor P2 and the NMOS transistor N2 are disposed in a second column COL2 adjacent to the first column COL1. The PMOS transistor P3 and the NMOS transistor N3 are disposed in a third column COL3 adjacent to the second column COL2, wherein the second column COL2 is arranged between the first column COL1 and the third column COL3. The PMOS transistor P4 and the NMOS transistor N4 are disposed in a fourth column COL4 adjacent to the third column COL3, wherein the third column COL3 is arranged between the second column COL2 and the fourth column COL4. By appropriately placing the transistors P1-P4 and N1-N4, layout area of the semiconductor device 100 can be minimized.

Figure 3:
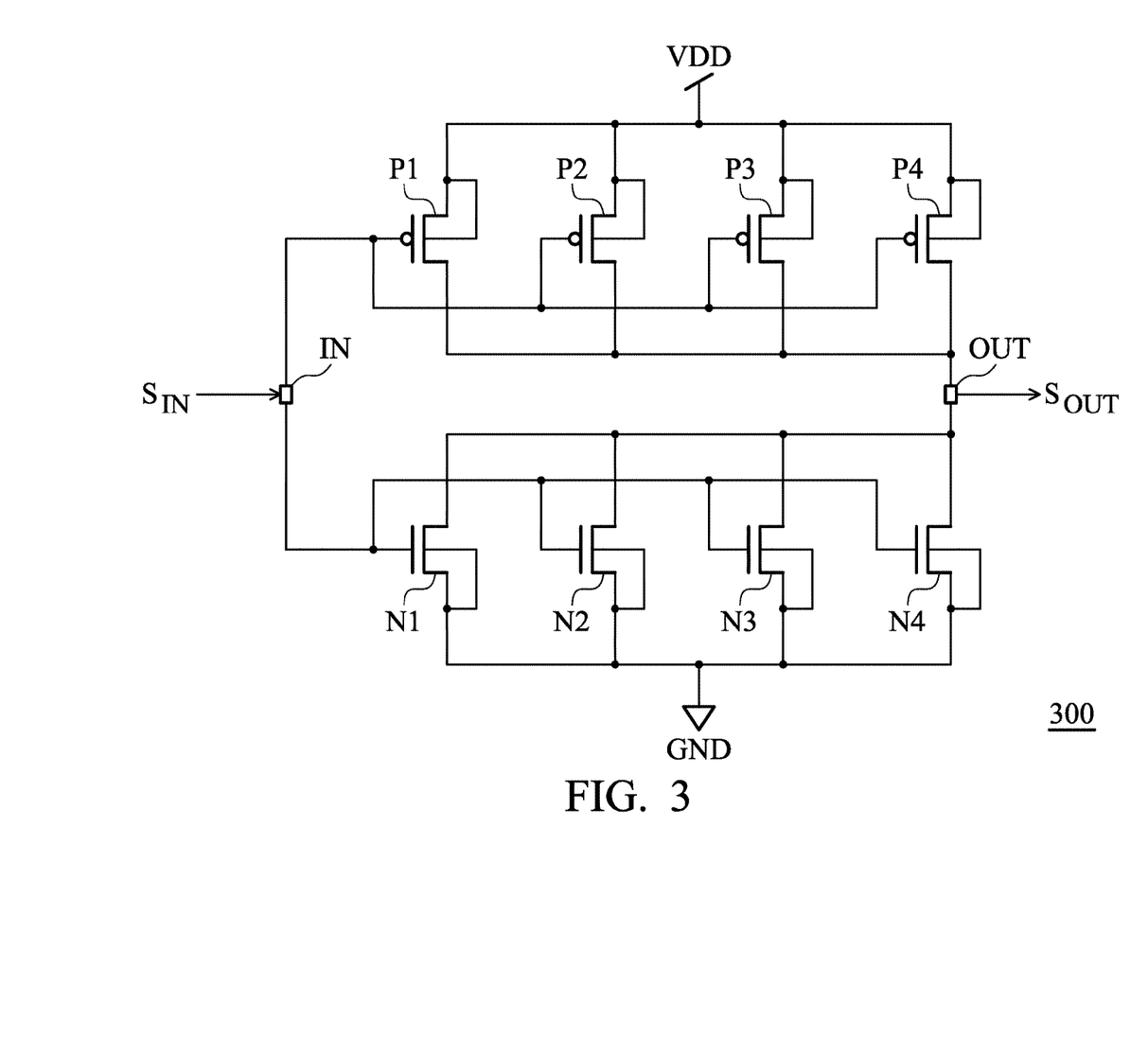
FIG. 3 shows a semiconductor device according to another embodiment of the invention.

FIG. 3 shows a semiconductor device 300 according to another embodiment of the invention. The semiconductor device 300 comprises the PMOS transistors P1-P4 and the NMOS transistors N1-N4. In the semiconductor device 300, the PMOS transistor P1 is coupled between a power VDD (i.e. a supply voltage) and the output terminal OUT. A gate of the PMOS transistor P1 is coupled to the input terminal IN, and the bulk of the PMOS transistor P1 is coupled to the power VDD. In the embodiment, the PMOS transistors P1-P4 are connected in parallel, and the PMOS transistors P2-P4 are also coupled between the power VDD and the output terminal OUT. Furthermore, each gate of the PMOS transistors P2-P4 is coupled to the input terminal IN, and each bulk of the PMOS transistors P2-P4 is coupled to the power VDD. In some embodiments, the PMOS transistors P1-P4 are the same size. In some embodiments, the PMOS transistors P1-P4 are different sizes. The NMOS transistor N1 is coupled between a ground GND and the output terminal OUT. A gate of the NMOS transistor N1 is coupled to the input terminal IN, and the bulk of the NMOS transistor N1 is coupled to the ground GND. In the embodiment, the NMOS transistors N1-N4 are connected in parallel, and the NMOS transistors N2-N4 are also coupled between the ground GND and the output terminal OUT. Furthermore, each gate of the NMOS transistors N2-N4 is coupled to the input terminal IN, and each bulk of the NMOS transistors N2-N4 is coupled to the ground GND. In some embodiments, the NMOS transistors N1-N4 are the same size. In some embodiments, the NMOS transistors N1-N4 are different sizes. In the embodiment, by connecting the NMOS transistors N1-N4 in parallel and the PMOS transistors P1-P4 in parallel, the semiconductor device 300 functions as an inverter with strong driving capability/strength. Thus, the semiconductor device 300 can be implemented in a clock path or a data path in a chip, so as to decrease time violations for a signal in the clock or data path.

Figure 4:
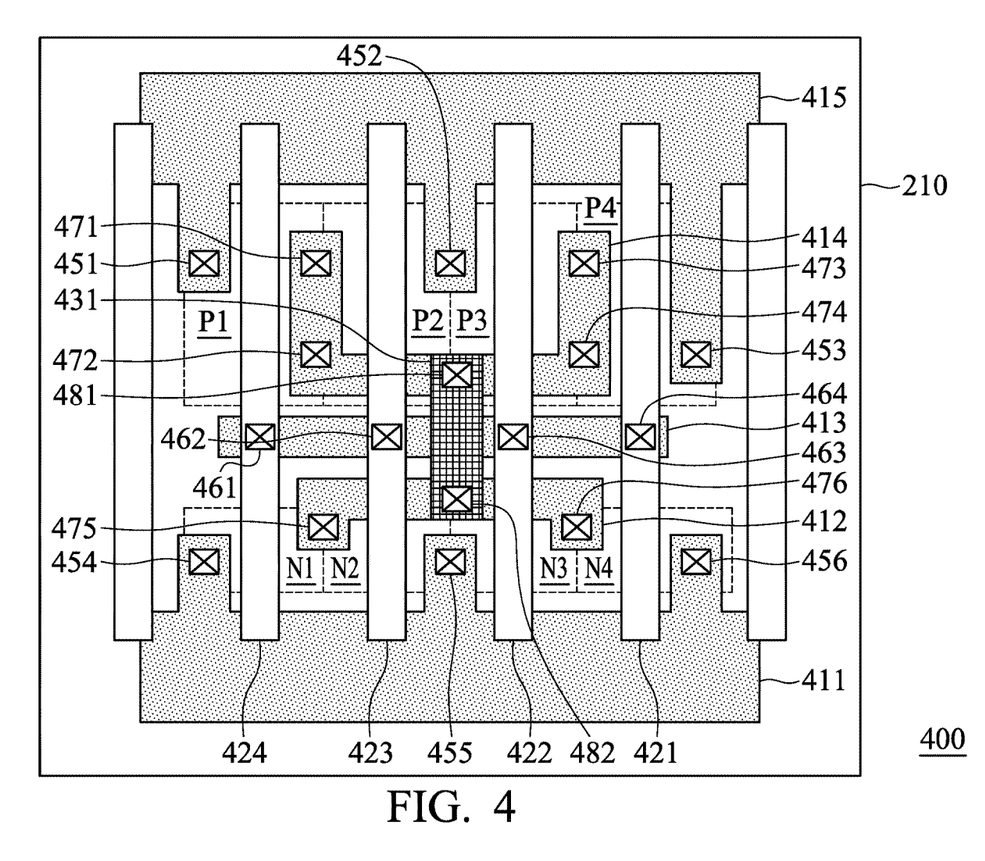
FIG. 4 shows a top view of a semiconductor structure of the semiconductor device of FIG. 3 according to an embodiment of the invention.

FIG. 4 shows a top view of a semiconductor structure 400 of the semiconductor device 300 of FIG. 3 according to an embodiment of the invention. The semiconductor structure 400 comprises the semiconductor substrate 210, a plurality of metals and the corresponding vias on the semiconductor substrate 210. As described above, the PMOS transistors P1-P4 and the NMOS transistors N1-N4 are implemented in the semiconductor substrate 210. In the embodiment, the metals 411-415 are disposed in a first metal layer on the semiconductor substrate 210, the metals 421-424 are disposed in a second metal layer on the first metal layer, and the metal 431 is disposed in a third metal layer on the second metal layer. In order to simplify the description, the interconnection of the semiconductor structure 400 below the first metal layer will not be described further, such as an oxide diffusion (OD) layer. Referring to FIGS. 3-4 together, the metal 415 is coupled to a power VDD, and the metal 411 is coupled to a ground GND. The source of the PMOS transistor P1 is coupled to the metal 415 through the via 451, the sources of the PMOS transistors P2-P3 are coupled to the metal 415 through the via 452, and the source of the PMOS transistor P4 is coupled to the metal 415 through the via 453. Furthermore, the source of the NMOS transistor N1 is coupled to the metal 411 through the via 454, the sources of the NMOS transistors N2-N3 are coupled to the metal 411 through the via 455, and the source of the NMOS transistor N4 is coupled to the metal 411 through the via 456. The gates of the NMOS transistors N1-N4 and the gates of the PMOS transistors P1-P4 are connected together through the vias 461-464 and the metal 413 (e.g. the input terminal IN), so as to receive the input signal $S_{IN}$. Furthermore, the drains of the PMOS transistors P1-P4 are coupled to the metal 414 through the vias 471-474, respectively. The drains of the NMOS transistors N1-N2 are coupled to the metal 412 through the via 475, and the drains of the NMOS transistors N3-N4 are coupled to the metal 412 through the via 476. By connecting the metals 414 and 412 through the vias 481 and 482 and the metal 431, the drains of the NMOS transistors N1-N4 and the drains of the PMOS transistors P1-P4 are connected together (e.g. the output terminal OUT) for providing the output signal $S_{OUT}$. It should be noted that the layout of the metals 411-415, 421-424 and 431 and the vias 451-456, 461-464, 471-476, and 481-182 is an example, and is not meant to limit the invention.

Figure 5:
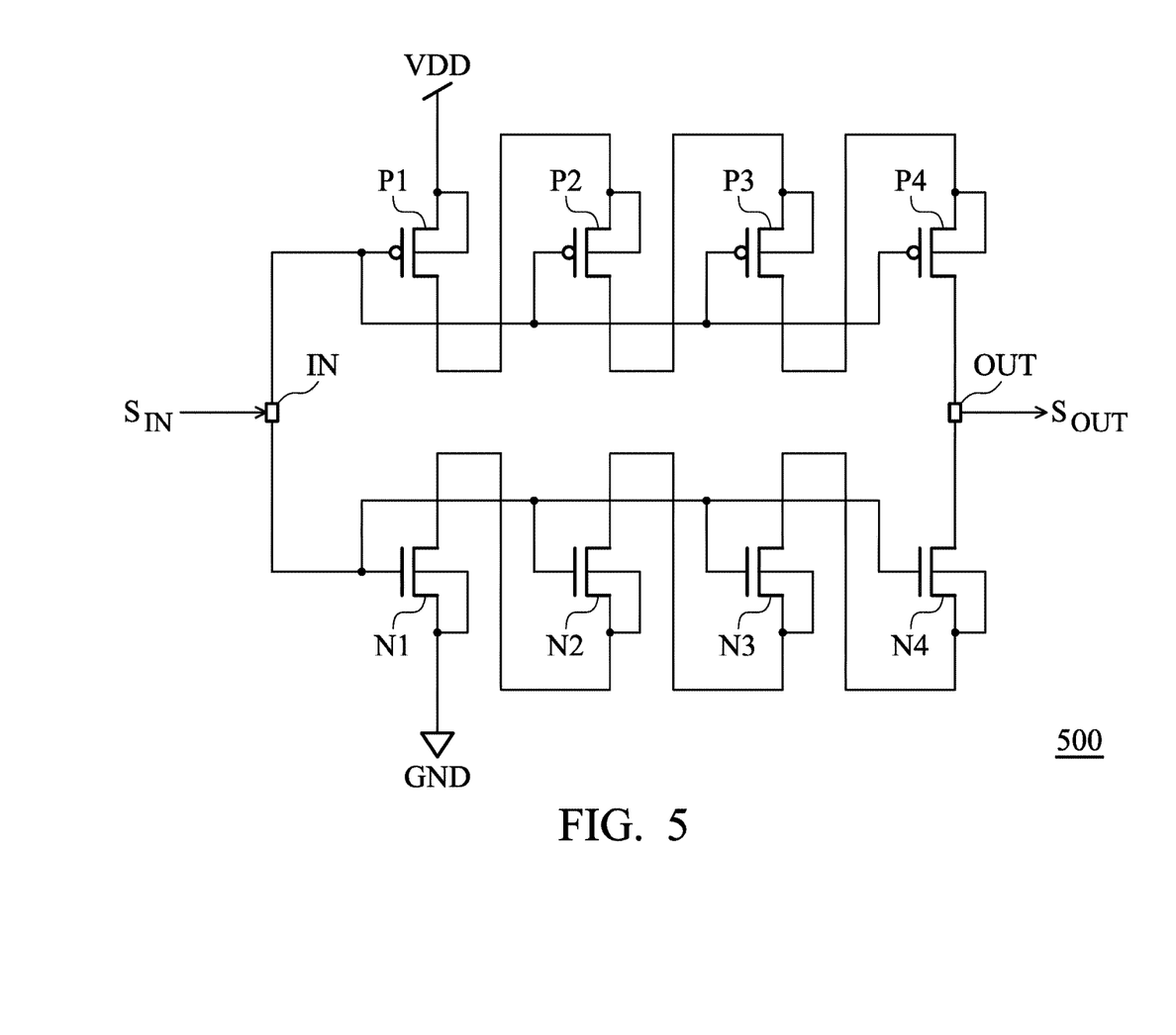
FIG. 5 shows a semiconductor device according to another embodiment of the invention.

FIG. 5 shows a semiconductor device 500 according to another embodiment of the invention. Similarly, the semiconductor device 500 comprises the PMOS transistors P1-P4 and the NMOS transistors N1-N4. In the semiconductor device 500, the PMOS transistors P1-P4 are connected in serial between a power VDD (i.e. a supply voltage) and the output terminal OUT. For example, the PMOS transistor P1 is coupled between the power VDD and the PMOS transistor P2, and the bulk of the PMOS transistor P1 is coupled to the power VDD. The PMOS transistor P2 is coupled between the PMOS transistors P1 and P3, and the bulk of the PMOS transistor P2 is coupled to the drain of the PMOS transistor P1. The PMOS transistor P3 is coupled between the PMOS transistors P2 and P4, and the bulk of the PMOS transistor P3 is coupled to the drain of the PMOS transistor P2. The PMOS transistor P4 is coupled between the PMOS transistor P3 and the output terminal OUT, and the bulk of the PMOS transistor P4 is coupled to the drain of the PMOS transistor P3. In some embodiments, the PMOS transistors P1-P4 are the same size. In some embodiments, the PMOS transistors P1-P4 are different sizes. It should be noted that the PMOS transistors P1-P4 of the semiconductor device 500 are identical to the PMOS transistors P1-P4 of the semiconductor device 300 of FIG. 3. Furthermore, the NMOS transistors N1-N4 are connected in serial between a ground GND and the output terminal OUT. For example, the NMOS transistor N1 is coupled between the ground GND and the NMOS transistor N2, and the bulk of the NMOS transistor N1 is coupled to the ground GND. The NMOS transistor N2 is coupled between the NMOS transistors N1 and N3, and the bulk of the NMOS transistor N2 is coupled to the drain of the NMOS transistor N1. The NMOS transistor N3 is coupled between the NMOS transistors N2 and N4, and the bulk of the NMOS transistor N3 is coupled to the drain of the NMOS transistor N2. The NMOS transistor N4 is coupled between the NMOS transistor N3 and the output terminal OUT, and the bulk of the NMOS transistor N4 is coupled to the drain of the NMOS transistor N3. In some embodiments, the NMOS transistors N1-N4 are the same size. In some embodiments, the NMOS transistors N1-N4 are different sizes. It should be noted that the NMOS transistors N1-N4 of the semiconductor device 500 are identical to the NMOS transistors N1-N4 of the semiconductor device 300 of FIG. 3. In the embodiment, by connecting the NMOS transistors N1-N4 in serial and the PMOS transistors P1-P4 in serial, the semiconductor device 500 functions as an inverter with a large delay capability. Thus, the semiconductor device 500 can be implemented in a clock path or a data path in a chip, so as to increase delay time for a signal in the clock or data path. For the same input signal $S_{IN}$, the delay time of the output signal $S_{OUT}$ provided by the semiconductor device 500 is longer than the delay time of the output signal $S_{OUT}$ provided by the semiconductor device 300.

Figure 6:
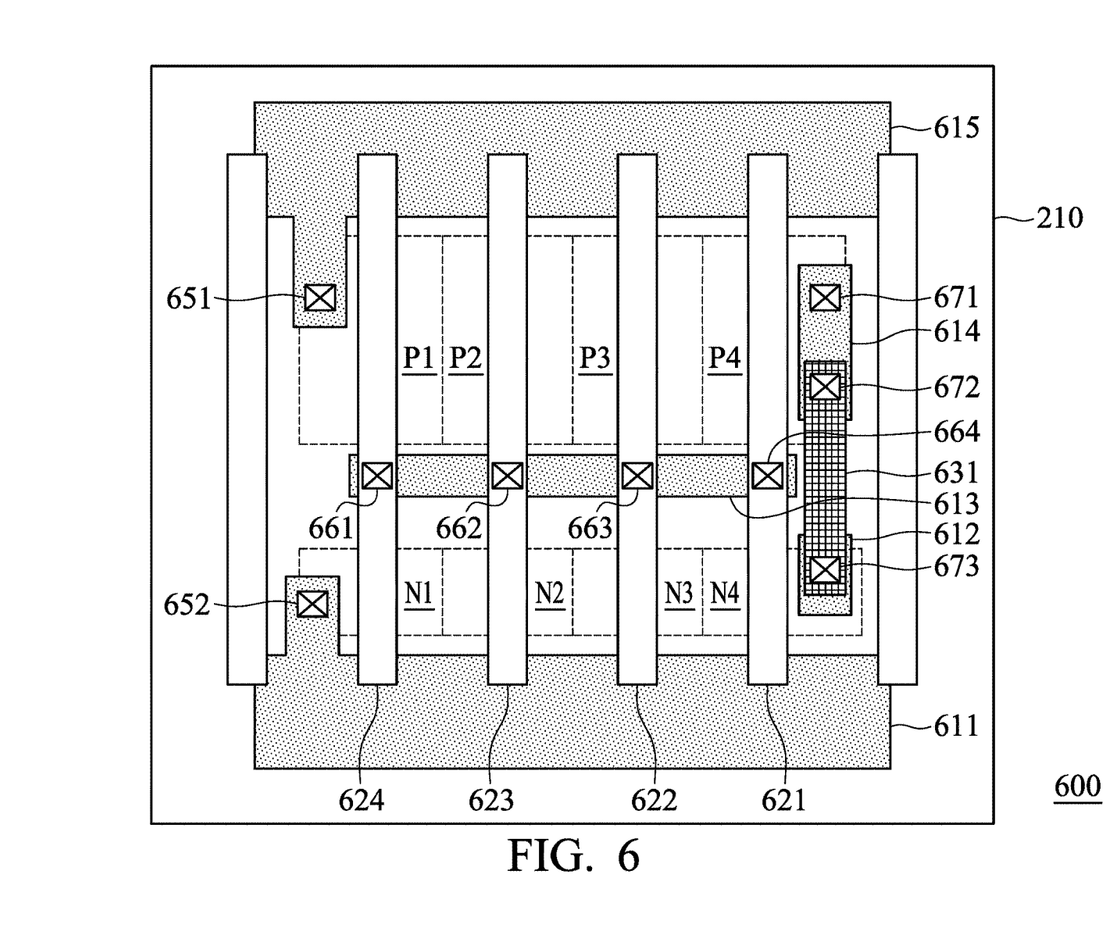
FIG. 6 shows a top view of a semiconductor structure of the semiconductor device of FIG. 5 according to an embodiment of the invention.

FIG. 6 shows a top view of a semiconductor structure 600 of the semiconductor device 500 of FIG. 5 according to an embodiment of the invention. The semiconductor structure 600 comprises the semiconductor substrate 210, a plurality of metals and the corresponding vias on the semiconductor substrate 210. As described above, the PMOS transistors P1-P4 and the NMOS transistors N1-N4 are implemented in the semiconductor substrate 210. In the embodiment, the metals 611-615 are disposed in a first metal layer on the semiconductor substrate 210, the metals 621-624 are disposed in a second metal layer on the first metal layer, and the metal 631 is disposed in a third metal layer on the second metal layer. In order to simplify the description, the interconnections of the semiconductor structure 600 below the first metal layer will not be described further. Referring to FIGS. 5-6 together, the metal 615 is coupled to a power VDD, and the metal 611 is coupled to a ground GND. The source of the PMOS transistor P1 is coupled to the metal 615 through the via 651. The source of the PMOS transistor P2 is coupled to the drain of the PMOS transistor P1 through a first interconnection (not shown), the source of the PMOS transistor P3 is coupled to the drain of the PMOS transistor P2 through a second interconnection (not shown), and the source of the PMOS transistor P4 is coupled to the drain of the PMOS transistor P3 through a third interconnection (not shown). In some embodiments, the first, second, and third interconnections are disposed in the OD layer. Furthermore, the source of the NMOS transistor N1 is coupled to the metal 611 through the via 652. The source of the NMOS transistor N2 is coupled to the drain of the NMOS transistor N1 through a fourth interconnection (not shown), the source of the NMOS transistor N3 is coupled to the drain of the NMOS transistor N2 through a fifth interconnection (not shown), and the source of the NMOS transistor N4 is coupled to the drain of the NMOS transistor N3 through a sixth interconnection (not shown). In some embodiments, the fourth, fifth, and sixth interconnections are disposed in the OD layer. The gates of the NMOS transistors N1-N4 and the gates of the PMOS transistors P1-P4 are connected together through the vias 661-664 and the metal 613 (e.g. the input terminal IN), so as to receive the input signal $S_{IN}$. Furthermore, the drain of the PMOS transistor P4 is coupled to the drain of the NMOS transistor N4 through the via 671, the metal 614, the via 672, the metal 631, the via 673 and the metal 612 (e.g. the output terminal OUT), so as to provide the output signal $S_{OUT}$. It should be noted that the layout of the metals 611-615, 621-624 and 631 and the vias 651-652, 661-664 and 671-673 is an example, and is not meant to limit the invention.

Figure 7:
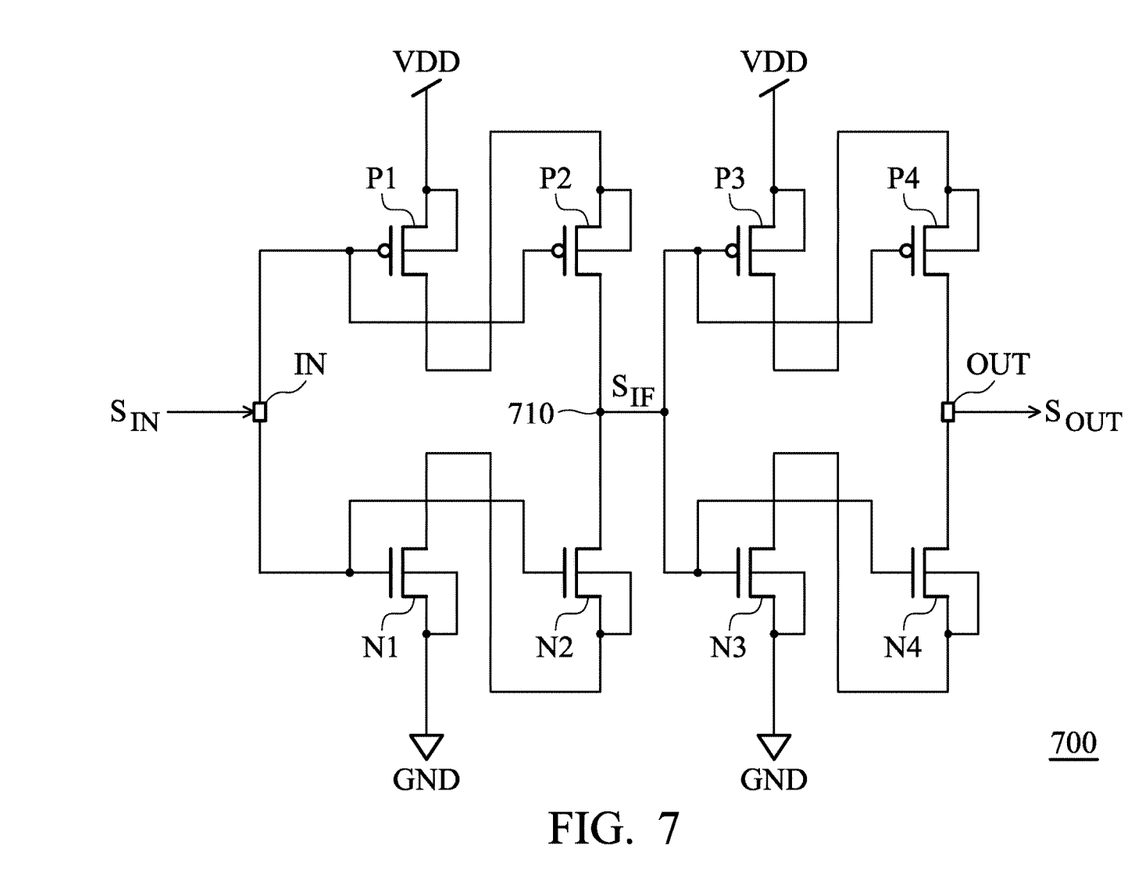
FIG. 7 shows a semiconductor device according to another embodiment of the invention.

FIG. 7 shows a semiconductor device 700 according to another embodiment of the invention. Similarly, the semiconductor device 700 comprises the PMOS transistors P1-P4 and the NMOS transistors N1-N4. In the semiconductor device 700, the PMOS transistors P1-P2 are connected in serial between a power VDD (i.e. a supply voltage) and a node 710, and the PMOS transistors P3-P4 are connected in serial between the node 710 and the output terminal OUT. For example, the PMOS transistor P1 is coupled between the power VDD and the PMOS transistor P2, and the bulk of the PMOS transistor P1 is coupled to the power VDD. The PMOS transistor P2 is coupled between the PMOS transistor P1 and the node 710, and the bulk of the PMOS transistor P2 is coupled to the drain of the PMOS transistor P1. Furthermore, the PMOS transistor P3 is coupled between the power VDD and the PMOS transistor P4, and the bulk of the PMOS transistor P3 is coupled to the power VDD. The PMOS transistor P4 is coupled between the PMOS transistor P3 and the output terminal OUT, and the bulk of the PMOS transistor P4 is coupled to the drain of the PMOS transistor P3. In some embodiments, the PMOS transistors P1-P4 are the same size. In some embodiments, the PMOS transistors P1-P4 are different sizes. It should be noted that the PMOS transistors P1-P4 of the semiconductor device 700 are identical to the PMOS transistors P1-P4 of the semiconductor device 300 of FIG. 3 and the semiconductor device 500 of FIG. 5. Furthermore, the NMOS transistors N1-N2 are connected in serial between a ground GND and the node 710, and the NMOS transistors N3-N4 are connected in serial between a ground GND and the output terminal OUT. For example, the NMOS transistor N1 is coupled between the ground GND and the NMOS transistor N2, and the bulk of the NMOS transistor N1 is coupled to the ground GND. The NMOS transistor N2 is coupled between the NMOS transistor N1 and the node 710, and the bulk of the NMOS transistor N2 is coupled to the drain of the NMOS transistor N1. Furthermore, the NMOS transistor N3 is coupled between the ground GND and the NMOS transistor N4, and the bulk of the NMOS transistor N3 is coupled to the ground GND. The NMOS transistor N4 is coupled between the NMOS transistor N3 and the output terminal OUT, and the bulk of the NMOS transistor N4 is coupled to the drain of the NMOS transistor N3. In some embodiments, the NMOS transistors N1-N4 are the same size. In some embodiments, the NMOS transistors N1-N4 are different sizes. It should be noted that the NMOS transistors N1-N4 of the semiconductor device 500 are identical to the NMOS transistors N1-N4 of the semiconductor device 300 of FIG. 3 and the semiconductor device 500 of FIG. 5. Moreover, the gates of the NMOS transistors N1-N2 and the PMOS transistors P1-P2 are coupled to the input terminal IN, and the gates of the NMOS transistors N3-N4 and the PMOS transistors P3-P4 are coupled to the node 710. In the embodiment, by connecting the NMOS transistors N1-N2 in serial and the PMOS transistors P1-P2 in serial, the NMOS transistors N1-N2 and the PMOS transistors P1-P2 form a first inverter with strong delay capability, wherein the first inverter provides an intermediate signal $S_{IF}$ complementary to the input signal $S_{IN}$. Furthermore, by connecting the NMOS transistors N3-N4 in serial and the PMOS transistors P3-P4 in serial, the NMOS transistors N3-N4 and the PMOS transistors P3-P4 form a second inverter with strong delay capability, wherein the second inverter provides the output signal $S_{OUT}$ complementary to the intermediate signal $S_{IF}$. Thus, by connecting the first and second inverters in serial, the semiconductor device 700 functions as a buffer with a large delay capability. Thus, the semiconductor device 700 can be implemented in a clock path or a data path in a chip, so as to increase delay time for a signal in the clock or data path. For the same input signal $S_{IN}$, the delay time of the output signal $S_{OUT}$ provided by the semiconductor device 500 is longer than the delay time of the output signal $S_{OUT}$ provided by the semiconductor device 700, and the delay time of the output signal $S_{OUT}$ provided by the semiconductor device 700 is longer than the delay time of the output signal $S_{OUT}$ provided by the semiconductor device 300.

Figure 8:
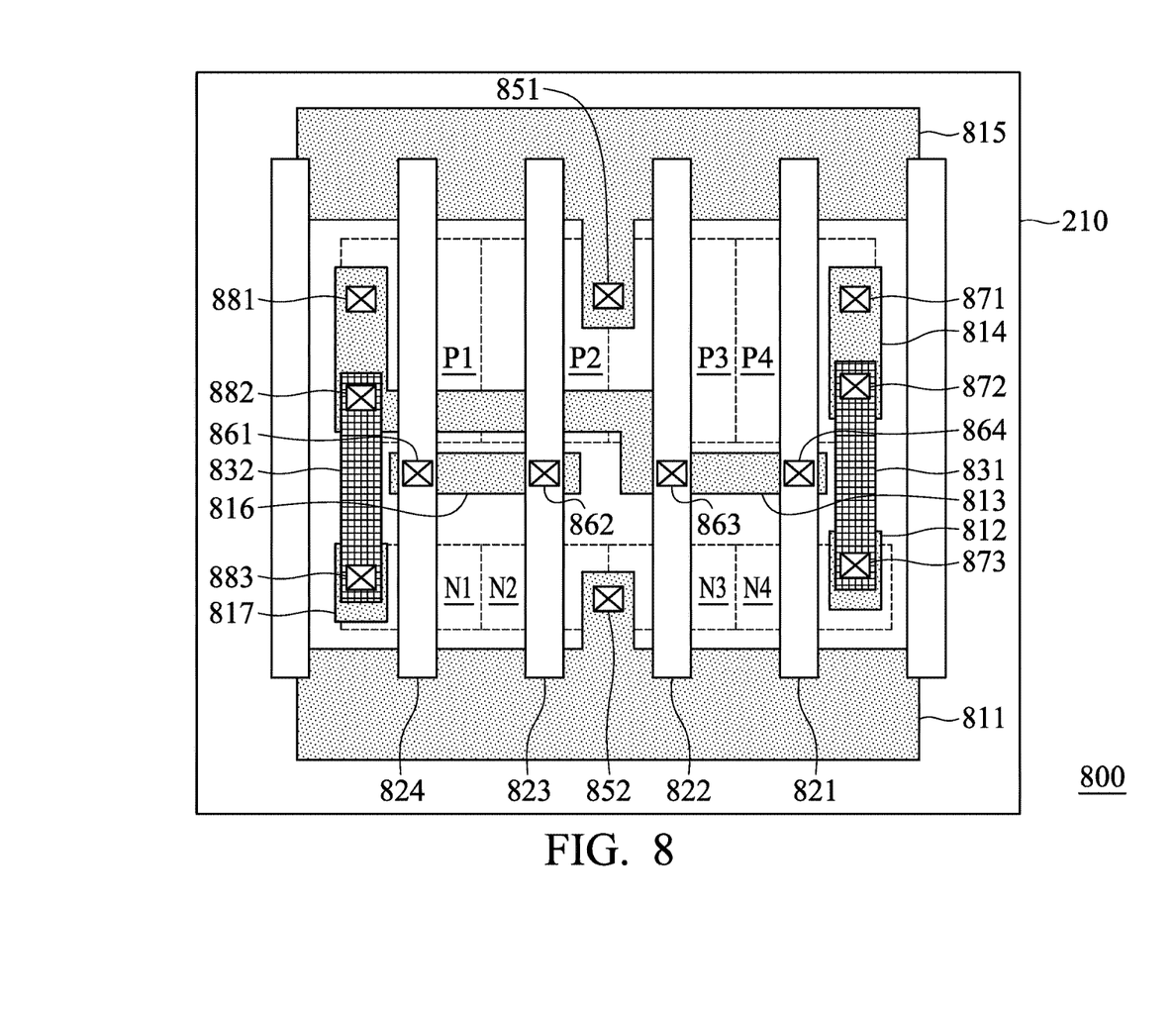
FIG. 8 shows a top view of a semiconductor structure of the semiconductor device of FIG. 7 according to an embodiment of the invention.

FIG. 8 shows a top view of a semiconductor structure 800 of the semiconductor device 700 of FIG. 7 according to an embodiment of the invention. The semiconductor structure 800 comprises the semiconductor substrate 210, a plurality of metals and the corresponding vias on the semiconductor substrate 210. As described above, the PMOS transistors P1-P4 and the NMOS transistors N1-N4 are implemented in the semiconductor substrate 210. In the embodiment, the metals 811-817 are disposed in a first metal layer on the semiconductor substrate 210, the metals 821-824 are disposed in a second metal layer on the first metal layer, and the metals 831-832 are disposed in a third metal layer on the second metal layer. In order to simplify the description, the interconnections of the semiconductor structure 800 below the first metal layer will not be described further. Referring to FIGS. 7-8 together, the metal 815 is coupled to a power VDD, and the metal 811 is coupled to a ground GND. The sources of the PMOS transistors P1 and P3 are coupled to the metal 815 through the via 851. The source of the PMOS transistor P2 is coupled to the drain of the PMOS transistor P1 through a first interconnection (not shown), and the source of the PMOS transistor P4 is coupled to the drain of the PMOS transistor P3 through a second interconnection (not shown). Furthermore, the sources of the NMOS transistors N1 and N3 are coupled to the metal 811 through the via 852. The source of the NMOS transistor N2 is coupled to the drain of the NMOS transistor N1 through a third interconnection (not shown), and the source of the NMOS transistor N4 is coupled to the drain of the NMOS transistor N3 through a fourth interconnection (not shown). In some embodiments, the first, second, third, and fourth interconnections are disposed in the OD layer. The gates of the NMOS transistors N1-N2 and the gates of the PMOS transistors P1-P2 are connected together through the vias 861-862 and the metal 816 (e.g. the input terminal IN), so as to receive the input signal $S_{IN}$. Furthermore, the drain of the PMOS transistor P2 is coupled to the drain of the NMOS transistor N2 through the via 881, the metal 813, the via 882, the metal 832, the via 883 and the metal 817 (e.g. the node 710), so as to provide the intermediate signal $S_{IF}$. The gates of the NMOS transistors N3-N4 and the gates of the PMOS transistors P3-P4 are connected together through the vias 863-864 and the metal 813 and further connected to the drains of the PMOS transistor P2 and the NMOS transistor N2 through the metal 813, so as to receive the intermediate signal $S_{IF}$. Furthermore, the drain of the PMOS transistor P4 is coupled to the drain of the NMOS transistor N4 through the via 871, the metal 814, the via 872, the metal 831, the via 873 and the metal 812 (e.g. the input terminal IN), so as to provide the output signal $S_{OUT}$. It should be noted that the layout of the metals 811-817, 821-824 and 831-832 and the vias 851-852, 861-864, 871-873 and 881-883 is an example, and is not meant to limit the invention.

According the embodiments, the semiconductor substrates of various semiconductor devices have the same base layout in the semiconductor substrate, i.e. the PMOS transistors P1-P4 and the NMOS transistors N1-N4 are kept for various semiconductor devices. By modifying the connections of the PMOS transistors P1-P4 and the NMOS transistors N1-N4 through the various metal layers and the corresponding vias on the semiconductor substrate (e.g. upper layer connections) and the OD layer, each semiconductor device can provide the output signal $S_{OUT}$ according to a specific logic function and the input signal $S_{IN}$ with strong driving capability or large delay capability. Due to the same base layout in the semiconductor substrate, the systematic layout dependent effect (LDE) and on-chip variation (OCV) are similar for the semiconductor devices. By using the semiconductor devices with the same base layout in the semiconductor substrate to insert buffers or inverters to reduce timing skew, different processes, temperatures and voltage corners will not influence the timing skew of the clock tree. It should be noted that the number of PMOS transistors and the NMOS transistors are merely exemplary. One skilled in the art can modify them to achieve a desired semiconductor device. For example, a semiconductor device can comprise 6 PMOS transistors and 6 NMOS transistors, or 8 PMOS transistors and 8 NMOS transistors.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A semiconductor structure, comprising:
 a semiconductor substrate, comprising:

first, second, third, fourth PMOS transistors, wherein the first, second, third and fourth PMOS transistors are disposed in a first row; and
first, second, third, fourth NMOS transistors, wherein the first, second, third and fourth NMOS transistors are disposed in a second row adjacent to the first row;
a plurality of metal layers on the semiconductor substrate; and
an oxide diffusion (OD) layer in the semiconductor substrate,
wherein gates of the first PMOS and NMOS transistors are connected together for receiving an input signal through the metal layers,
wherein gates of the second PMOS and NMOS transistors are connected together through the metal layers,
wherein gates of the third PMOS and NMOS transistors are connected together through the metal layers,
wherein gates of the fourth PMOS and NMOS transistors are connected together through the metal layers, and drains of the fourth PMOS and NMOS transistors are connected together for providing an output signal via the metal layer,
wherein the first, second, third and fourth NMOS transistors are connected in parallel through the metal layers and the OD layer, the first, second, third and fourth PMOS transistors are connected in parallel through the metal layers and the OD layer, or
wherein the first and second NMOS transistors are connected in serial through the metal layers and the OD layer, and the first and second PMOS transistors are connected in serial through the metal layers and the OD layer, or
wherein the third and fourth NMOS transistors are connected in serial through the metal layers and the OD layer, and the third and fourth PMOS transistors are connected in serial through the metal layers and the OD layer.

2. The semiconductor structure as claimed in claim 1, wherein the first NMOS and PMOS transistors are disposed in a first column, the second NMOS and PMOS transistors are disposed in a second column adjacent to the first column, the third NMOS and PMOS transistors are disposed in a third column adjacent to the second column, and the fourth NMOS and PMOS transistors are disposed in a fourth column adjacent to the third column.

3. The semiconductor structure as claimed in claim 2, wherein the second column is arranged between the first and third columns, and the third column is arranged between the second and fourth columns.

4. The semiconductor structure as claimed in claim 1, wherein the gates of the first, second, third and fourth NMOS transistors and the gates of the first, second, third and fourth PMOS transistors are connected together for receiving the input signal.

5. The semiconductor structure as claimed in claim 4, wherein the first, second, third and fourth NMOS transistors are connected in parallel and the first, second, third and fourth PMOS transistors are connected in parallel, and the output signal is complementary to the input signal with a first delay time.

6. The semiconductor structure as claimed in claim 1, wherein the first, second, third and fourth NMOS transistors are connected in parallel and the first, second, third and fourth PMOS transistors are connected in parallel, and the gates of the first, second, third and fourth NMOS transistors and the gates of the first, second, third and fourth PMOS transistors are connected together for receiving the input signal, and the output signal is complementary to the input signal.

7. The semiconductor structure as claimed in claim 1, wherein the first, second, third and fourth NMOS transistors are the same size, and the first, second, third and fourth PMOS transistors are the same size.

8. The semiconductor structure as claimed in claim 1, wherein the first, second, third and fourth NMOS transistors are connected in parallel, and sources of the first, second, third and fourth NMOS transistors are coupled to a ground, and the first, second, third and fourth PMOS transistors are connected in parallel, and sources of the first, second, third and fourth PMOS transistors are coupled to a supply voltage.

* * * * *